(12) United States Patent
Markman

(10) Patent No.: US 7,289,569 B2
(45) Date of Patent: Oct. 30, 2007

(54) HDTV TRELLIS DECODER ARCHITECTURE

(75) Inventor: Ivonete Markman, Carmel, IN (US)

(73) Assignee: Thomson Licensing, Boulogne-Billancourt (FR)

(*) Notice: Subject to any disclaimer, the term of this patent is extended or adjusted under 35 U.S.C. 154(b) by 366 days.

(21) Appl. No.: 10/511,398

(22) PCT Filed: Apr. 1, 2003

(86) PCT No.: PCT/US03/09862

§ 371 (c)(1),
(2), (4) Date: Oct. 14, 2004

(87) PCT Pub. No.: WO03/090451

PCT Pub. Date: Oct. 30, 2003

(65) Prior Publication Data

US 2005/0141629 A1     Jun. 30, 2005

Related U.S. Application Data

(60) Provisional application No. 60/372,971, filed on Apr. 16, 2002.

(51) Int. Cl.
*H04L 5/12* (2006.01)
(52) U.S. Cl. .................. 375/265; 375/316; 375/340; 375/341
(58) Field of Classification Search .......... 375/265
See application file for complete search history.

(56) References Cited

U.S. PATENT DOCUMENTS 5,287,385 A * 2/1994 Sugawara et al. .......... 375/341
5,384,809 A * 1/1995 Yagi et al. .................. 375/261
5,583,889 A * 12/1996 Citta et al. .................. 375/341
5,600,677 A * 2/1997 Citta et al. .................. 375/296
5,838,729 A * 11/1998 Hu et al. ..................... 375/265
5,841,478 A * 11/1998 Hu et al. ................. 375/240.25

(Continued)

OTHER PUBLICATIONS

William W. Lin et al. "A Trellis Decoder for HDTV", Sarnoff Corporation US, Aug. 1999, IEEE Transactions on Consumer Electronics, vol. 45, No. 3, pp. 571-576.
Search Report Dated Jul. 27, 2003.

*Primary Examiner*—David C. Payne
*Assistant Examiner*—Leon-Viet Q Nguyen
(74) *Attorney, Agent, or Firm*—Joseph J. Laks; Ronald H. Kurdyla; Guy H. Eriksen

(57) ABSTRACT

A trellis decoding system for use in processing a High Definition Television signal. The trellis decoding system includes a traceback unit that identifies a sequence of antecedent trellis states in accordance with a state transition trellis. A branch metric computer includes eight discrete subunits, one for each possible trellis state. Each subunit generates two output bits indicative of the two trellis branches exiting the trellis state represented by that particular subunit. An add-compare-select unit includes eight discrete subunits, each associated with a particular trellis state. Each subunit includes as an input two bits received from the branch metric computer and as an output two bits. Bit 31 is chosen from 28 and 29. Bit 6 is chosen from the branch metric information input to each subunit. A traceback control memory unit includes an N to 1 multiplexer which receives as an input the output bits from the add-compare-select unit. The present system offers a hardware reduction from prior art.

18 Claims, 10 Drawing Sheets

U.S. PATENT DOCUMENTS

| | | | |
|---|---|---|---|
| 5,881,106 A | * | 3/1999 | Cartier ........................ 375/262 |
| 5,923,711 A | * | 7/1999 | Willming ..................... 375/287 |
| 6,141,384 A | * | 10/2000 | Wittig et al. ........... 375/240.25 |
| 6,304,616 B1 | * | 10/2001 | Alberty ....................... 375/340 |
| 6,343,103 B1 | * | 1/2002 | Lou et al. ................... 375/261 |
| 2002/0001353 A1 | | 1/2002 | Citta et al. |

* cited by examiner

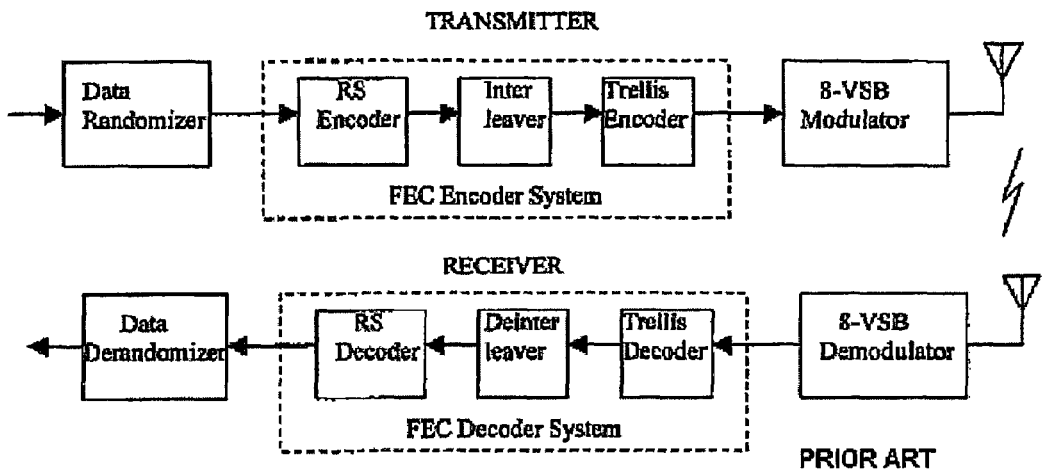
Fig. 1 -
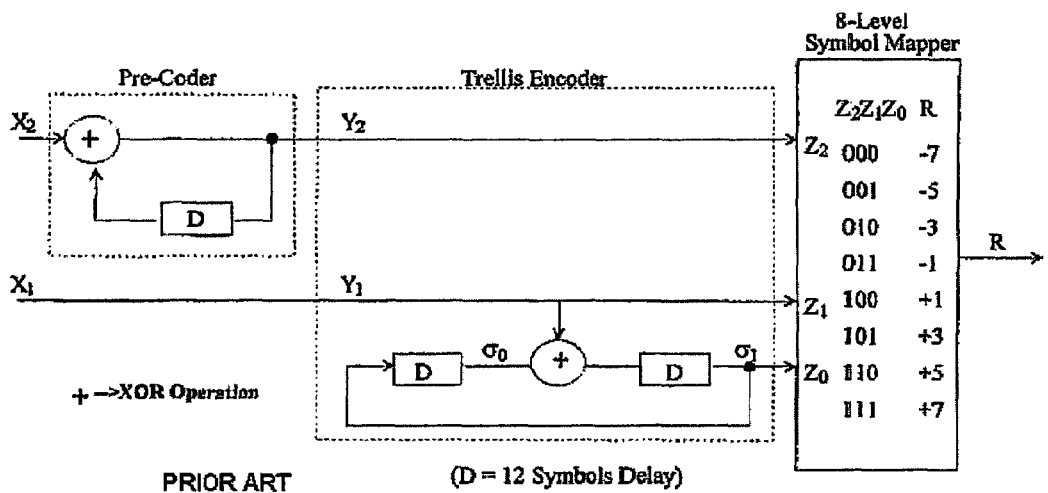
Fig. 2

D = 1 symbol delay for each of the 12 decoders

Distance computer algorithm do (where u or v can replace d)

HDTV TRELLIS DECODER ARCHITECTURE

This application claims the benefit, under 35 U.S.C. § 365 of International Application PCT/USO3/09862, filed Apr. 1. 2003, which was published in accordance with PCT Article 21(2) on Oct. 30, 2003 in English and which claims the benefit of United States provisional patent application No. 60/372,971, filed on Apr. 16, 2002.

FIELD OF THE INVENTION

This invention relates generally to the field of digital signal processing and more particularly to a trellis decoder suitable for decoding multiple mode trellis encoded High Definition Television (HDTV) signals.

BACKGROUND OF THE INVENTION

The Advanced Television Systems Committee (ATSC) standard for HDTV in the United States specifies an eight bit (eight levels per symbol) vestigial sideband (VSB) transmission system which includes forward error correction (FEC) as a means of improving system performance. The transmission FEC system consists of a Reed Solomon encoder followed by a byte interleaver and a trellis encoder. The receiving system includes a corresponding trellis decoder, byte deinterleaver and Reed Solomon decoder. Trellis coding is used in combination with other techniques to protect against interference from particular noise sources. FIG. 1 is a simplified block diagram of a typical HDTV transmitter and receiver emphasizing the FEC components.

Trellis coding requirements for HDTV are presented in sections 4.2.4-4.2.6 (Annex D), 10.2.3.9, 10.2.3.10 and other sections of the Digital Television Standards for HDTV Transmission of Apr. 12, 1995 prepared by the ATSC. The HDTV standard presents a trellis coding system that employs an interleaving function involving twelve parallel trellis encoders at a transmitter and twelve parallel trellis decoders at a receiver for processing twelve interleaved data streams. The trellis system employed utilizes a rate ⅔ trellis coded modulation (TCM) code. The code is implemented by coding one bit using a rate ½, four state convolutional encoder, and then adding an FEC uncoded bit which is differentially precoded. Each set of three coded bits produced by the encoder is mapped to an eight level VSB modulator symbol. FIG. 2 is a block diagram showing the differential precoder, trellis encoder and corresponding eight level VSB symbol mapper. The twelve identical encoders and precoders are used sequentially, processing each one byte at a time and subsequently transmitting one complete symbol at a time. The input data bits X1 and X2 are encoded as three bits Z2, Z1, and Z0. Each three bit word corresponds to one of the eight symbols R. X2 is processed by a precoder to provide encoded bit Z2. X1 is encoded as two bits Z1 and Z0 by the trellis encoder. FIG. 3 depicts the twelve encoder interleaving scheme, while FIG. 4 shows the twelve decoder deinterleaving system.

The need for the twelve encoder interleaving originates with the requirement of eliminating possible National Television Standard Committee (NTSC) analog television co-channel interference, which will coexist with HDTV for the foreseeable future. An NTSC rejection filter is used with a null at or near the NTSC audio, chroma and video carriers. The filter is a twelve symbol tapped delay line added to the demodulator, and is used only when NTSC interference is actually detected, as discussed in U.S. Pat. No. 5,086,340, entitled CO-CHANNEL INTERFERENCE REDUCTION SYSTEM FOR DIGITAL HIGH DEFINITION TELEVISION, issued Feb. 4, 1992 to Citta et al. When no NTSC interference is detected, the optimum trellis decoder for the additive white Gaussian noise (AWGN) channel is a four state Viterbi decoder. When NTSC interference is present, the NTSC rejection filter introduces correlation in the received signal that adds complexity to the optimum trellis decoder. The twelve encoder/decoder interleaving scheme allows each decoder to view a rejection filter with a one symbol delay instead of a twelve symbol delay. This permits the optimum trellis decoder to be implemented as an eight state Viterbi decoder. FIG. 5 is a diagram of a trellis decoding system with and without the NTSC rejection filter for each of the twelve sequential decoders.

In the absence of NTSC interference, the optimum HDTV trellis decoder contains a four state trellis as shown in FIG. 6. Each branch of the trellis is composed of two transitions associated with a paired set, or coset a, b, c or d. The two symbols of each coset are seen in Table 1.

TABLE 1

| Cosets | Eight Level VSB Symbols |
| --- | --- |
| a = (a−, a+) | (−7, +1) |
| b = (b−, b+) | (−5, +3) |
| c = (c−, c+) | (−3, +5) |
| d = (d−, d+) | (−1, +7) |

FIG. 6 depicts the relationship between the transitions and the corresponding encoder inputs X2 and X1. Each state of the four state trellis is identified by a binary representation on one side of the trellis and by a decimal representation on the other side of the trellis.

In the case when NTSC interference is present and the NTSC rejection filter is active, each of the twelve trellis decoders receives a partial response signal, the rejection filter having a one symbol delay per decoder. The additional memory delay introduced by the rejection filter will cause the resultant trellis decoder to be a combination of the filter transfer function and the four state trellis. The resultant partial response trellis decoder is equivalent to a trellis decoder with an eight state trellis.

As shown in FIG. 6, each state of the eight state trellis is identified by its binary representation and by its relationship to the four state trellis states, as well as the coset associated with both sets of trellis branches which converge into the state. Each of the four states in the original trellis is split into two components, with each component associated with a different coset representing a branch into that state. For example, state 0 in the four state trellis becomes states 0a and 0c in the eight state trellis. The state 0a represents only transitions into the state associated with coset a, and the state 0c represents the transitions into the state associated with coset c. Thus all of the branches leading to state 0a are associated with coset a and all of the branches leading to state 0c are associated with coset c.

FIG. 7 is a simplified block diagram of the trellis coded modulation communication system under NTSC co-channel interference. The data input sequence is denoted by x; z is the encoder output sequence, transmitted sequence or codeword; w is the AWGN sequencer; r is the received symbol sequence; y is the NTSC rejection filter output sequence and x* is the decoded data sequence. The trellis decoder receives at its input a partial response signal plus noise. The partial response signal is derived from the eight level VSB symbols and is known as fifteen level VSB since it has fifteen possible amplitude levels ranging from −7 to +7.

U.S. Pat. No. 5,841,478, entitled CODE SEQUENCE DETECTION IN A TRELLIS DECODER, issued Nov. 24, 1998 to Hu et al., discloses an adaptive trellis decoder which can seamlessly switch between both modes (NTSC or no NTSC interference present) as well as sequentially decode the twelve deinterleaved coded sequences described by FIG. 4. The simplified block diagram of the Hu et al. device shown in FIG. 8 depicts a trellis decoder having two main inputs, namely the received sequence of coded symbols and a control input, vsb_mode that identifies the input mode as either eight level or fifteen level VSB. Additional inputs not included in FIG. 8 are the clock and the global system reset. The decoder output is a sequence of decoded bytes.

The received sequence of coded symbols serves as the input to the synchronization control unit, which detects field and segment synchronization patterns within the symbol sequence and generates the corresponding sync signals. These sync signals are then used to create an enable signal that identifies the coded data within the received symbol sequence and eliminates the sync patterns. The coded data sequence is then forwarded to the branch metric computer (BMC) and delay units. Additionally, the synchronization and control unit generates a registered reset signal which is used to reset the decoder at power on, whenever an out of sync condition occurs or in response to another input such as a global reset. Both the reset and enable signals are sent to the other decoder units.

The BMC unit computes the metric values between each received encoded symbol and the encoded symbols associated with the trellis branches. The BMC unit is composed of eight BMC subunits, one for each state. Each BMC subunit computes the metric for the two branches out of the state according to the protocol of FIG. 6, and then sends its pair of branch metrics to the add-compare-select (ACS) unit. The control input vsb_mode identifies whether the metric is associated with the eight level VSB or fifteen level VSB mode. The decoder architecture utilizes the eight state trellis depicted in FIG. 6 for both modes of operation because the eight state trellis can mimic the operation of the four state trellis.

The ACS unit is also split into eight subunits, one per state, with each having an associated stored path metric value. The ACS unit receives the sixteen branch metrics and adds them to the corresponding eight stored path metric values in order to generate sixteen temporary path metric values. Subsequently each ACS subunit compares the two temporary path metric values corresponding to the two branches leading to its state. Each ACS subunit then selects the minimum path metric value leading to its state and returns this information to the BMC unit, as well as updating its corresponding stored path metric value. The BMC unit needs information about the prior coded symbol into each state in order to compute the metrics in the case of NTSC interference. The ACS unit also generates a bit pointer for each state identifying which branch of the pair of branches leading to the state is associated with the minimum path leading to that state. The eight bit pointers are then sent to the traceback unit. The ACS unit also chooses, among the eight state path metrics, the one path with the minimum value and sends the minimum state information to the traceback unit. Finally, the ACS unit sends path metric information to the synchronization monitor unit.

The synchronization monitor unit determines whether the received symbol sequence is properly aligned by the synchronization control unit by observing metric values associated with one of the eight trellis states and comparing them with a threshold value. If the threshold value is not satisfied an out of sync signal is sent to the synchronization control unit.

The traceback control and memory unit stores the received bit pointers associated with each minimum state path in a buffer memory. The stored bit pointers are used to trace backwardly through the trellis while the newly received bit pointers are used to trace forwardly through the trellis. As a result the traceback control and memory unit generates a sequence of trellis decoded decision bits reflecting information bits X1 as described in FIGS. 2 and 6. These decoded bits are sent to the re-encoder and trellis demapper.

The re-encoder is a replica of FIG. 2, using the received decoded bits to generate equivalent Z0 and Z1 bits. These re-encoded bits are forwarded to the trellis demapper. Simultaneously, a delayed version of the received sequence of coded symbols is generated by the delay unit and sent to the trellis demapper. The trellis demapper uses the delayed received coded sequence, together with the re-encoded bits Z0 and Z1 to identify the encoded bit Z2 and the corresponding information bit X2. The trellis demapper then sends the decoded bits X1 and X2 to the byte assembler, which organizes the information bits into bytes.

The motivation for the use of a re-encoder and a trellis demapper is to decode the information bit X2 since no information about that bit was sent by the BMC unit to the ACS and traceback units. Hence, there is a need for a delay unit which delays the received coded sequence in order to recover that information. This delay is relatively long in duration since it must accommodate the delay in all of the units that it bypasses, namely the BMC, ACS and traceback units. The traceback unit in particular typically has a large memory block and associated resultant latency. The received coded sequence is generally quantized to a large number of bits (eight to ten) representing a total memory delay of substantial size. A trellis architecture is needed that eliminates the need for re-encoding, demapping and the relatively large delay unit.

BRIEF SUMMARY OF THE INVENTION

The present invention is a trellis decoder system which accommodates the twelve decoder interleaving structure of the ATSC HDTV standard as well as the NTSC interference mode. The present invention includes an adaptive trellis decoder that seamlessly switches between multiple operational modes and decodes input interleaved codes. The present system permits a reduction in hardware. This system can be applied to similar trellis decoder devices which need to adaptively switch between multiple modes and which need to decode input interleaved codes.

The present design eliminates three of the operational blocks present in prior trellis decoding architecture. In particular, the delay unit, re-encoder and the trellis demapper are not necessary due to novel improvements in the branch metric computer (BMC), the add-compare-select unit (ACS) and the traceback unit. The remaining elements, such as the synchronization control, synchronization monitor and byte assembler remain unchanged. The present invention utilizes the fact that information concerning bit X2 is present at the BMC unit, and such information is forwarded to the ACS and traceback units, thereby eliminating the need for re-encoding, demapping and the large delay unit.

BRIEF DESCRIPTION OF THE DRAWING

In the drawing:

FIG. 1 is a simplified block diagram of a prior art HDTV transmitter and receiver system;

FIG. 2 is a block diagram of a prior art HDTV trellis encoder, differential precoder and symbol mapper;

DETAILED DESCRIPTION OF THE INVENTION

Figure 8:
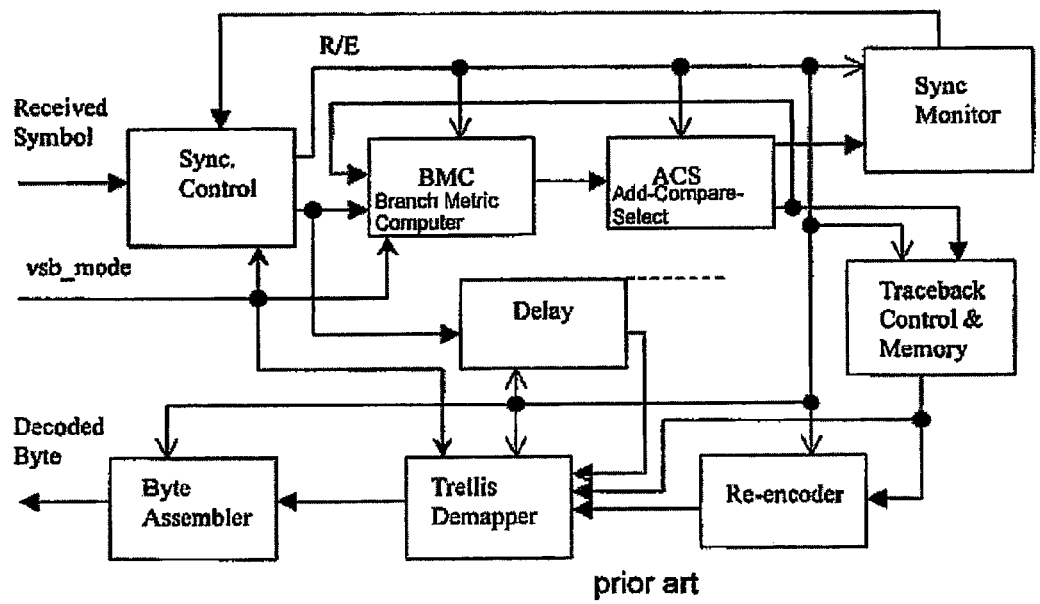
FIG. 8 is block diagram of prior art trellis decoder architecture.
Figure 9:
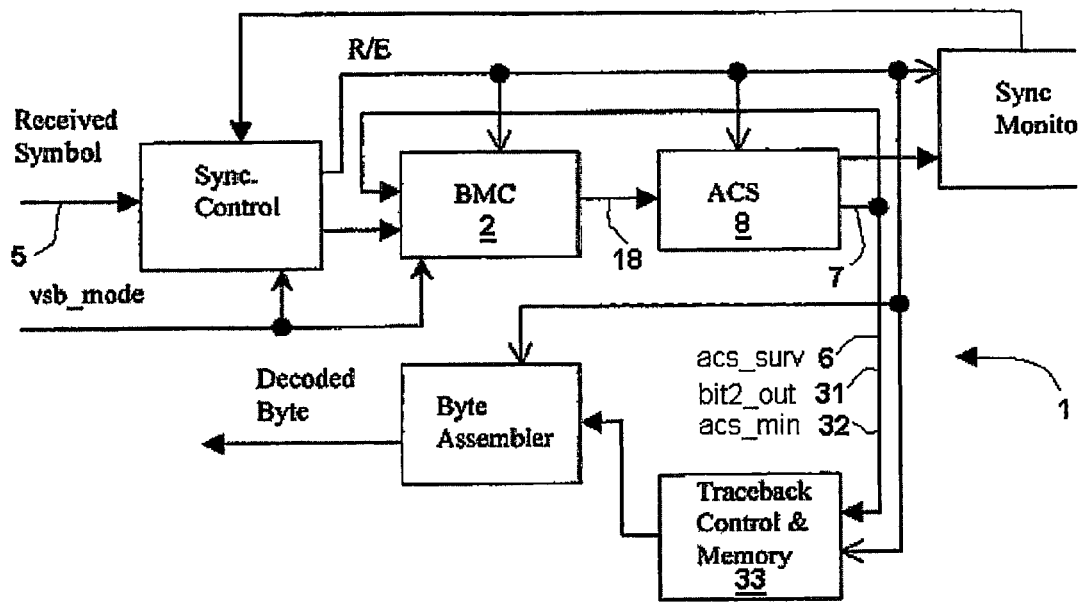
FIG. 9 is a block diagram of a trellis decoder system constructed according to the principles of the present invention.
Figure 10:
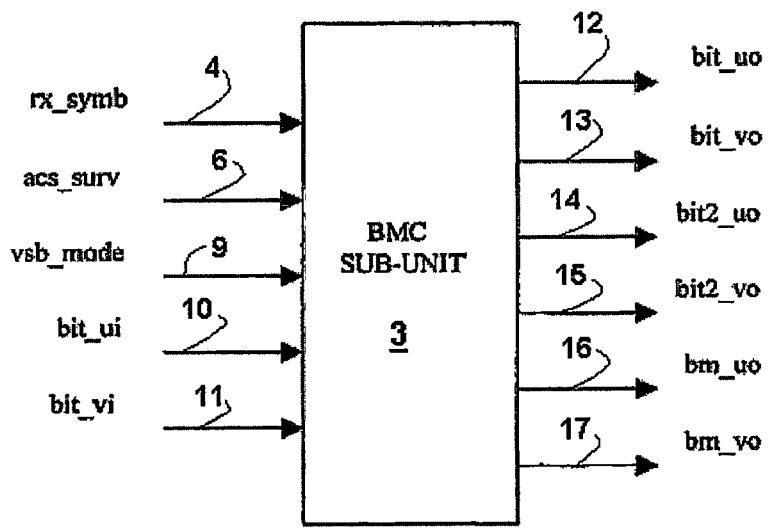
FIG. 10 is an input/output diagram of the BMC subunit constructed according to the principles of the present invention.

Referring to FIG. 9, a simplified block diagram of the present invention shows a trellis decoder 1 having three fewer elements than the prior art trellis decoder architecture depicted in FIG. 8. As in the prior art BMC, the improved BMC unit 2 includes eight BMC subunits, with each subunit corresponding to an individual trellis state. As seen in FIG. 10, each BMC subunit 3 includes several inputs and outputs, the clock, reset and enable inputs being excluded for clarity. The input 4 of BMC subunit 3 is rx_symb, which is the received symbol 5 for each sample appearing at the input to the trellis decoder 1. Input 6 is acs_surv, which is the bit input generated from the output 7 of the ACS unit 8. Input 6 indicates the survivor path into the particular BMC subunit trellis state for the previous trellis branch. As one can see by inspection of FIG. 6, there are two survivor paths into each state which are derived from two different previous states.

The input 9 is vsb_mode, which is a control bit having a value of zero for the four state trellis corresponding to the eight level VSB case where no NTSC rejection filter is present. The input 9 has a value of one for the eight state trellis corresponding to the fifteen level VSB case created when the NTSC rejection filter is used. Input 10 is bit_ui and input 11 bit_vi, these inputs corresponding to an output bit from one of the eight BMC subunits 3 during the previous trellis branch computation. The symbol ui is generated when the input 6 is a zero, and the symbol vi is generated when the input 6 has a value of one.

Figure 3:
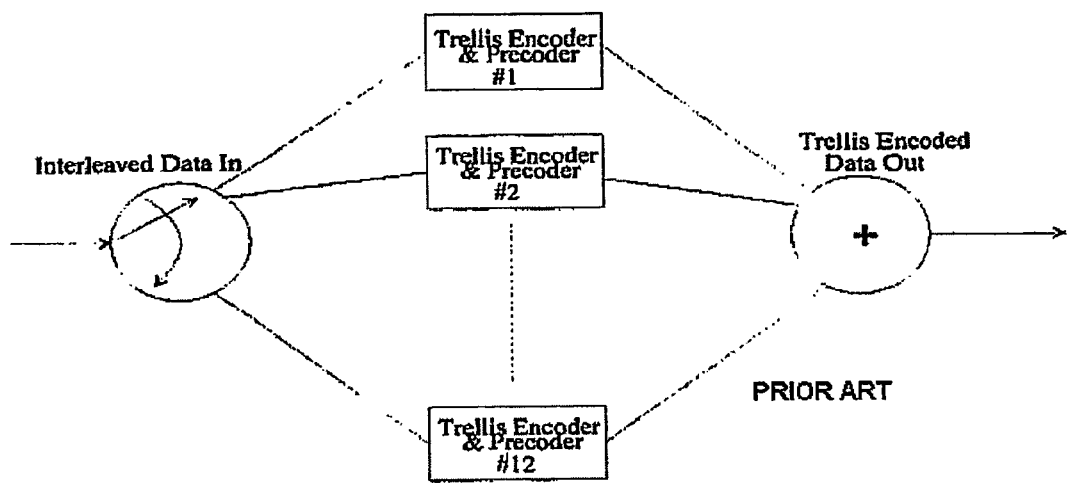
FIG. 3 is a block diagram of a prior art HDTV trellis encoder interleaver.
Figure 4:
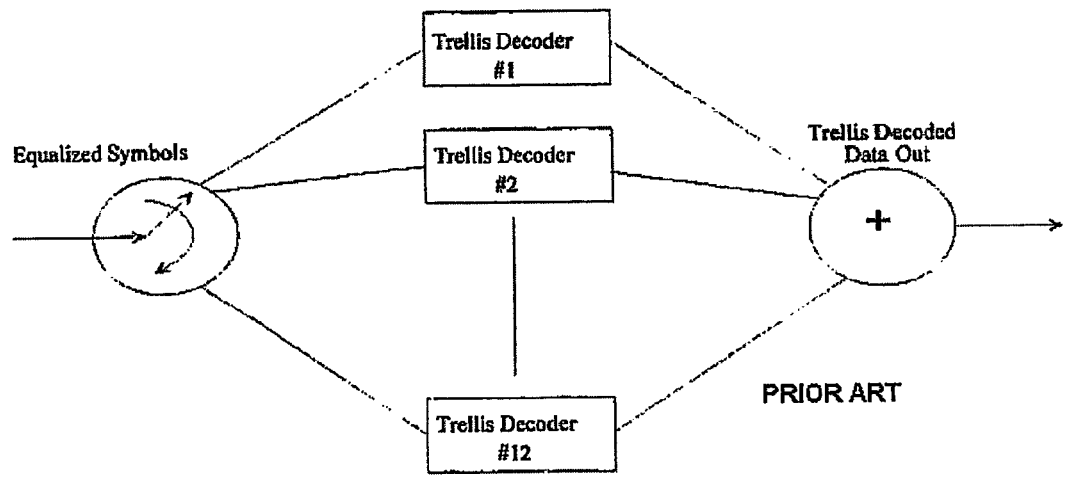
FIG. 4 is a block diagram of a prior art HDTV trellis decoder deinterleaver.
Figure 5:
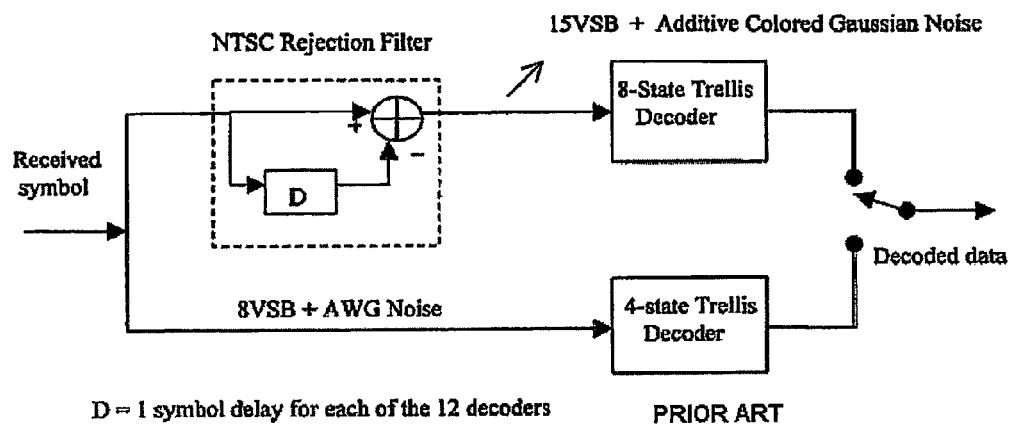
FIG. 5 is a block diagram of a prior art HDTV trellis decoder showing the presence and absence of an NTSC rejection filter
Figure 6:
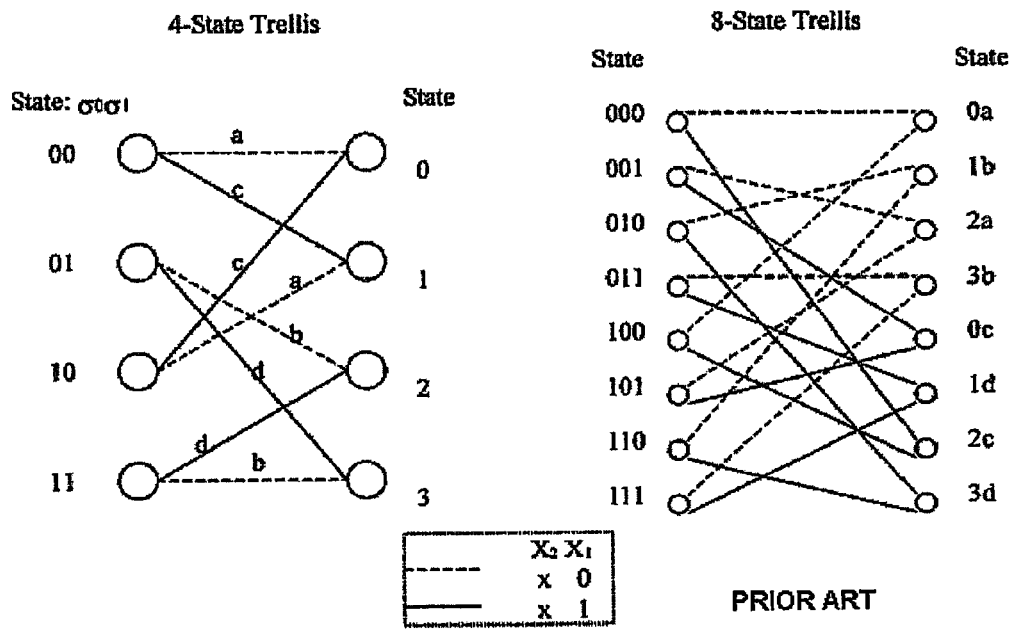
FIG. 6 is a schematic diagram of prior art four and eight state trellises.
Figure 7:
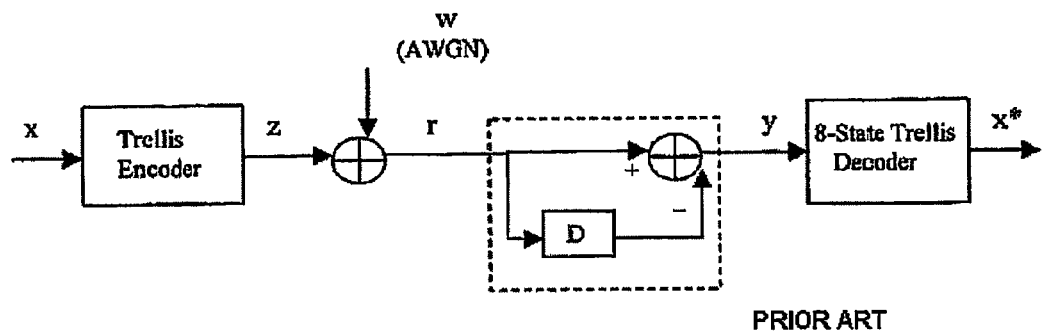
FIG. 7 is a schematic diagram of a prior art trellis coded modulation system with NTSC interference rejection.

The output 14 is bit2_uo and the output 15 is bit2_vo. The two branches leading from the state represented by subunit 3 are labeled uo and vo, and the output bits corresponding to these branches are bit2_uo and bit2_vo, respectively. Their values are calculated for the current branch. The symbols uo and vo are associated with the input bit X1 as depicted in FIGS. 2 and 6. The uo bit is generated when bit X1 has a value of zero, while the bit vo occurs when the value of bit X1 is one. The output bits 14 and 15 represent the estimated information bit X2 for the corresponding branches u and v, and serve as inputs 18 to the ACS unit 8. The output 12 is bit_uo and the output 13 is bit_vo. Outputs 12 and 13 are equal to outputs 14 and 15, respectively, except that the outputs 12 and 13 are delayed by one branch before being outputted. The output 16 is bm_uo and the output 17 is bm_vo, which are the output branch metrics, respectively, for the current trellis branches uo and vo out of the state represented by the particular subunit 3. The outputs 16 and 17 serve as inputs 18 to the ACS unit 8.

Figure 11:
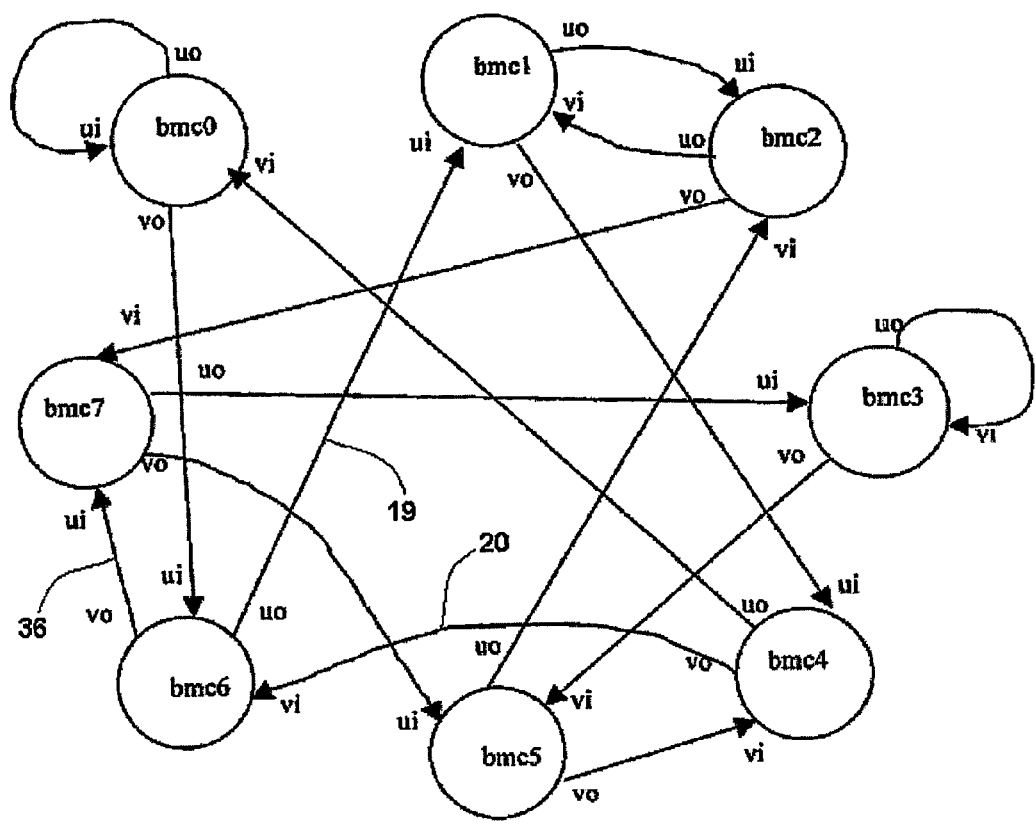
FIG. 11 is a schematic diagram of the inputs and outputs for the trellis states for the BMC subunits as depicted in FIG. 10.

Referring also to FIG. 11, the interconnection of the eight discrete BMC subunits is shown. The symbols uo and vo are associated with the outputs 12 and 13 of each BMC subunit. For example, for the subunit bmc6, the output bit_uo of path 19 is associated with the trellis branch created when the input bit X1 is equal to zero, that is, the trellis branch leading to state 1. However, according to the metric computation performed in BMC unit 2, the value of bit_uo or bit_vo reflects the most likely value of the bit X2 seen in FIGS. 2 and 6.

The symbol ui is generated when the input 6 is a zero, and the symbol vi is generated when the input 6 has a value of one. Input 6 is the acs_surv bit, which is the bit input generated from the output 7 of the ACS unit 8. In this manner, the value of input 6 indicates the survivor (minimum metric) path into the particular BMC subunit trellis state for the previous trellis branch. For example, if the acs_surv bit sent as an input to bcm6 is a one, this indicates that the surviving path 20 into state 6 comes from state 4 because the bit_vi has been selected in response to the value of the acs_surv bit. In other words, if the acs_surv bit has a value of one, the subunit 3 receiving that acs_surv bit will choose bit_vi.

Figure 12:
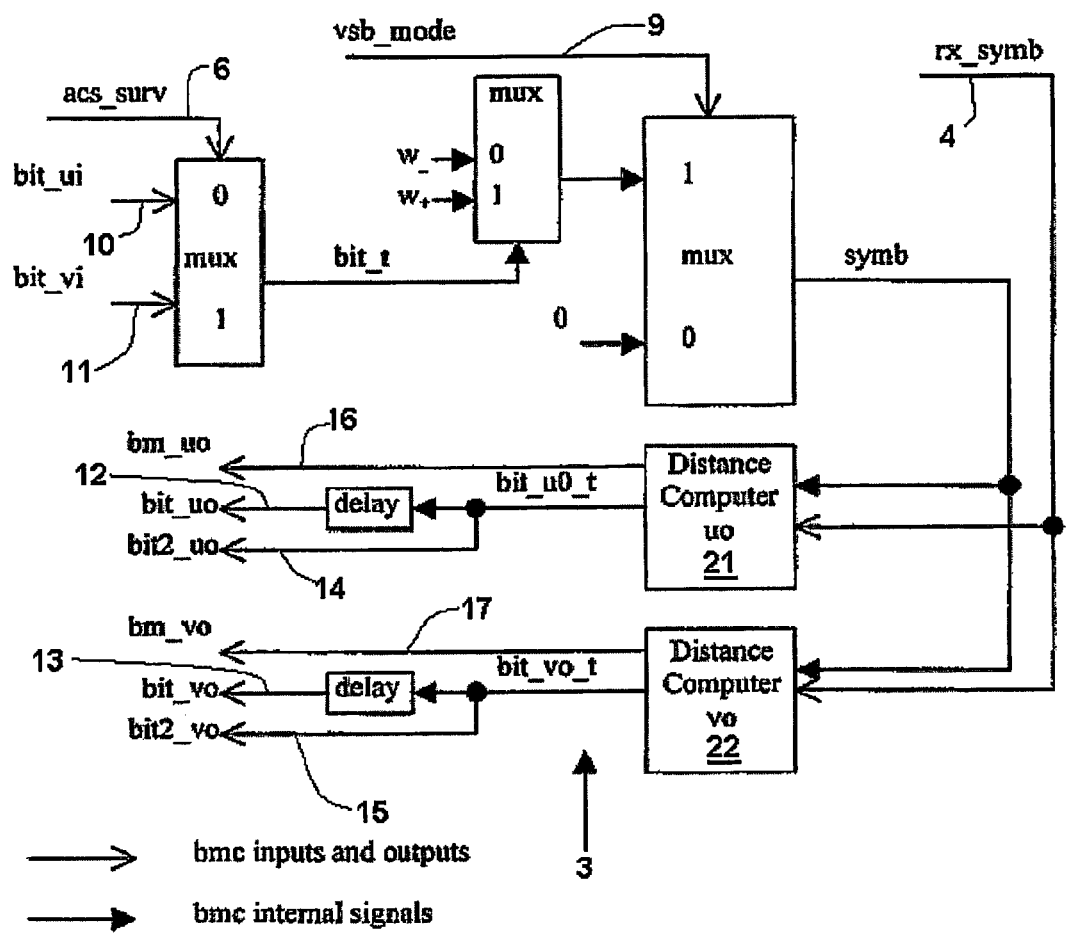
FIG. 12 is a block diagram of the BMC subunits as depicted in FIG. 10.
Figure 13:
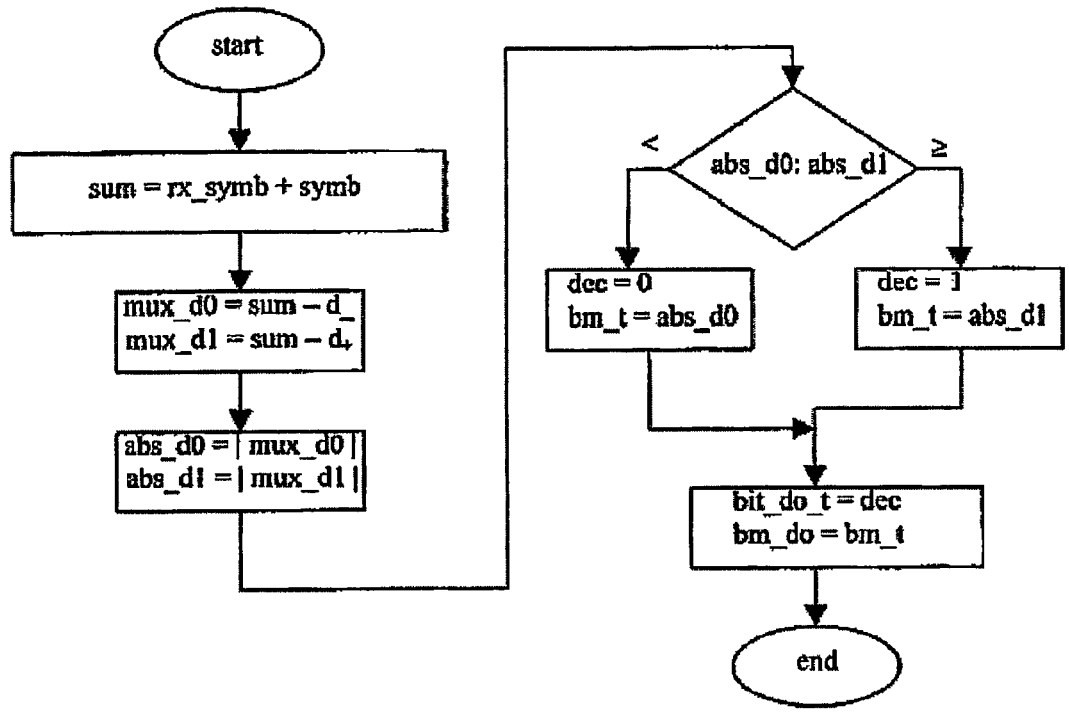
FIG. 13 is a flow chart depicting the distance computer algorithm utilized in the present invention.

Referring also to FIG. 12, the elements of the BMC subunit 3 can be seen. The distance computers 21 and 22 are similar, and may be programmed or designed to achieve a particular desired metric. The constants w− and w+ are the symbols of the coset associated with the previous branch into the particular state selected by the acs_surv bit. Each state has the values set forth in FIG. 6. Referring also to FIG. 13, the algorithm used by the distance computers 21 and 22 can be understood. This algorithm calculates the absolute Euclidean metric described in U.S. Pat. No. 5,841,478. In the algorithm, the value of d is replaced by u or v in order to generate the values of uo and vo, respectively. The constants d− and d+ are actually u− and u+, or v− and v+, for distance computers 21 (uo) and 22 (vo), respectively. These constants correspond to the symbols of the coset associated with the branches u or v out of the particular state.

As seen in FIG. 6, each state has its corresponding values. Other algorithms may be used for different metrics as desired.

Figure 14:
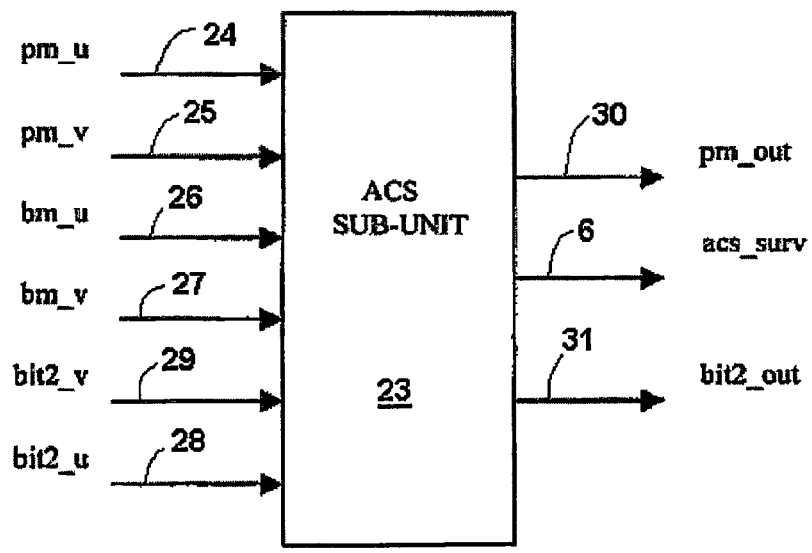
FIG. 14 is a schematic diagram of the ACS subunit constructed according to the principles of the present invention.

A significant improvement of the present invention from the prior art in U.S. Pat. No. 5,841,478 is the inclusion of the outputs 14 and 15 in the BMC subunit 3. The output bits 14 and 15 represent the estimated information bit X2 for the corresponding branches u and v, respectively, and serve as inputs 18 to the ACS unit 8. The ACS unit 8 is divided into eight subunits 23, each one of the subunits 23 corresponding to a particular trellis state. As best seen in FIG. 14, each ACS subunit 23 includes a pm_u input 24 and a pm_v input 25. The inputs 24 and 25 contain the stored metric values of states u and v, respectively, which merge into the particular state represented by the subunit 23. The bm_u input 26 and the bm_v input 27 are the branch metrics generated by the BMC subunits 3 for the current trellis branches u and v (0 and 1), respectively, which merge into the particular ACS subunit state. The bit2_u input 28 and the bit2_v input 29 represent the estimated information bit X2 generated by the BMC subunits 3 for the current trellis branches u and v (0 and 1) respectively, which merge into the particular ACS 23 subunit state. The bit2_u and bit2_v inputs are the instantaneous selections of the bit2_uo and bit2_vo outputs 14 and 15, respectively, received from each BMC subunit 3.

The pm_out output 30 of subunit 23 is the updated path metric associated with the particular ACS subunit state. The path metric value is updated after the original pm_u and pm_v values are added to the corresponding bm_u input 26 and bm_v input 27 values. A comparison is made between the metric values u and v and the minimum value is selected as the value to be assigned to pm_out 30. The acs_surv output bit 6 is zero or one depending on the choice of the minimum metric path leading to a state, based on the algorithm used to define the minimum metric path. The bit2_out output 31 is the estimated information bit X2 which is chosen from the two inputs 28 and 29 (bit2_u and bit2_v, respectively) based on the value of the acs_surv bit 6. A zero value for bit 6 selects bit2_u input 28 while a one value for bit 6 selects the bit2_v input 29.

Figure 15:
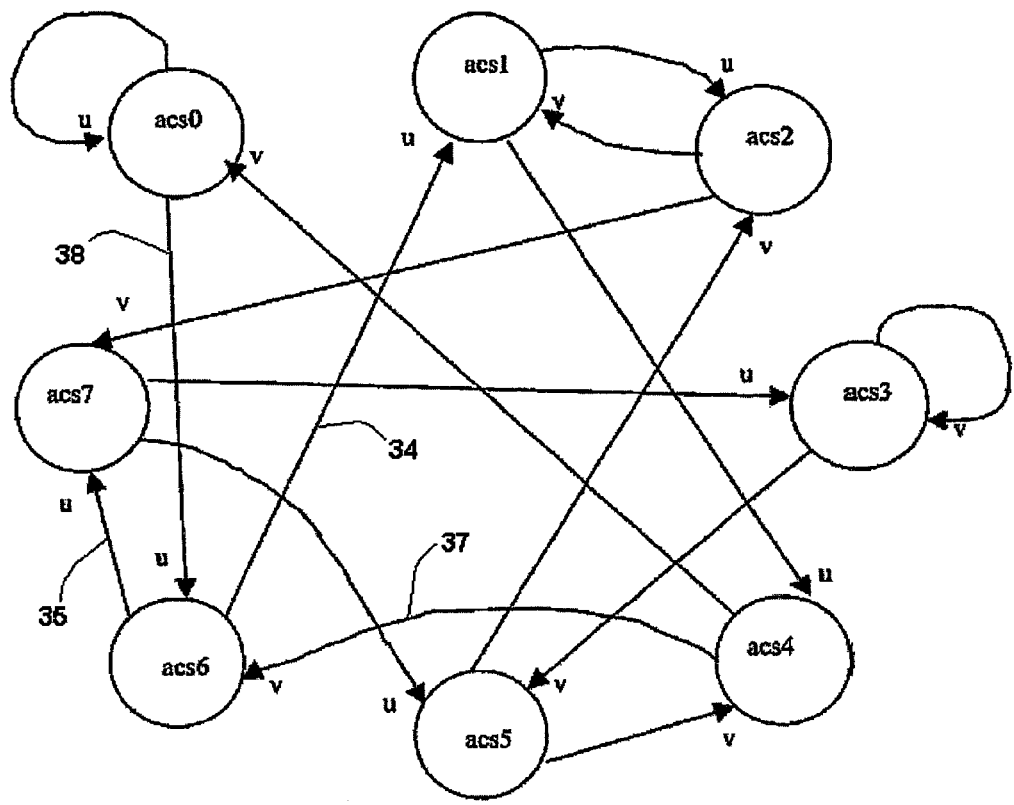
FIG. 15 is a schematic diagram of the inputs and outputs of the ACS subunit depicted in FIG. 14.

In addition to the eight ACS subunits 23, the ACS unit 8 compares the pm_out 30 metrics of all of the subunits 23, and identifies the particular subunit 23 having the minimum metric, which is identified as acs_min 32. The acs_min 32 is an input to the traceback unit 33. Alternatively, the state associated with the acs_min value can be fixed since existing traceback units have sufficient traceback depths that all states are likely to contain the same past information. FIG. 15 depicts the interconnection of the eight ACS subunits 23. The symbols u and v are associated with the inputs pm_u 24 and pm_v 25, or bm_u 26 and bm_v 27, respectively, of each ACS subunit 23. The relationship between any two ACS subunits follows the relationship between a corresponding pair of BMC subunits 3 as depicted in FIG. 11. Further, the relationship between any BMC subunit 3 and any ACS subunit 23 is defined by the relationships depicted in FIGS. 11 and 15. For example, acs6 provides an output 34 to acs1 and an output 35 to acs7. Similarly, acs6 provides outputs to bmc1 and bmc7. The BMC subunit bmc6 provides an output 19 to bmc1 and an output 36 to bmc7. Similarly, bmc6 provides outputs to acs1 and acs7. Conversely, the ACS subunit acs6 cannot provide an output to acs5 or to bmc5, and bmc6 cannot provide outputs to bmc5 or acs5. As in the case of the BMC, if the acs_surv bit 6 generated by acs6 has a value of one, the survivor path (or minimum metric path) into state 6 must come from state 4 along path 37, because a bit 6 value of one means that the bit v is selected as the survivor. It also means that bit2_out is equal to bit2_v. If the bit 6 value is instead zero, the survivor path into state 6 must come from state 0 along path 38, because a bit 6 value of zero means that bit u is selected as the survivor. It also means that bit2_out is equal to bit2_u.

Figure 16:
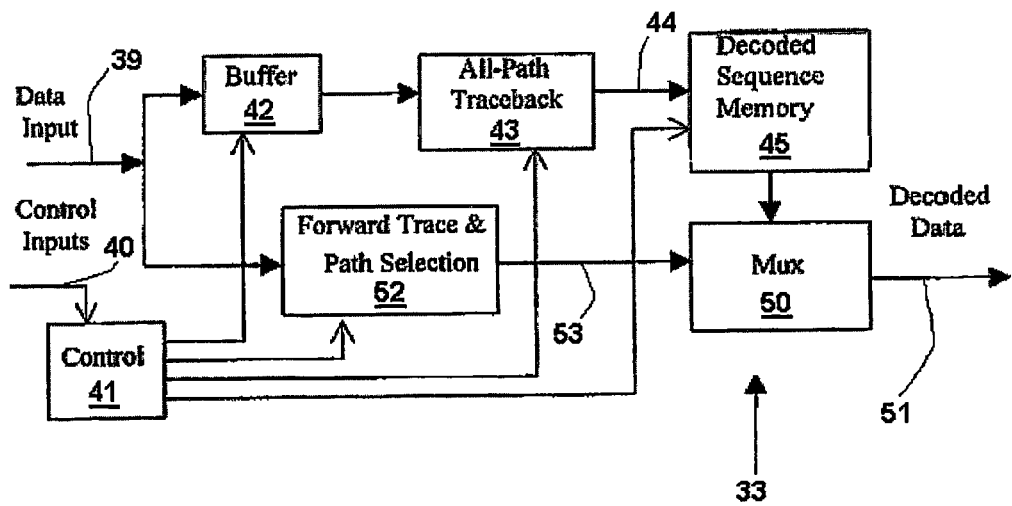
FIG. 16 is a block diagram of the all path traceback and forward trace unit constructed according to the principles of the present invention.

Referring also to FIG. 16, the improved traceback unit 33 can be understood. In a preferred embodiment the particular protocol used is the All Path Traceback/Forward Trace (APTFT) algorithm. Alternatively, any general traceback algorithm may be used as well as a register exchange algorithm. A significant improvement of the present invention from the prior art in U.S. Pat. No. 5,841,478 is the inclusion of the inputs 28 and 29 (bit2_u and bit2_v) and the corresponding output 31 (bit2_out) in the ACS subunit 23. The bit2_out bit 31, as well as the acs_surv bit 6 of the ACS unit 8 serve as the data input 39 for the traceback unit 33 for all eight states and for each trellis branch. The control inputs 40 include a clock, enable, reset, any sync signals and the acs_min 32 that appears as an output of the ACS unit 8 in order to identify the minimum metric state for each trellis branch. The control unit 41 generates all of the control signals and read/write addressing of the various memory blocks.

The buffer 42 is a last in, first out (LIFO) memory having a size of T*N, where T is a predetermined survivor memory depth and N is the number of states per trellis, which is equal to eight. The buffer 42 temporarily stores the outputs from the ACS unit 8. Data in the form of two bits per branch (acs_surv bit 6 and bit2_out bit 31) is written to buffer 42 in the order of arrival, N states at a time. The data is read in the reverse order during the following epoch, an epoch being characterized by the size of the buffer memory divided by the number of branches, that is, T/2. After each read operation, a new set of input data is written into the same memory location. In order to store the additional input bit2_out bit 31 (the estimated information bit X2) for each trellis state, the size of the buffer 42 is twice as large as that required by prior art traceback units.

The control unit 41 directs the all path traceback unit 43 to read the buffer memory 42 from the previous epoch, in the reverse order of storage. The acs_surv bits 6 are actually pointers to the previous state in the trellis survivor path leading to a particular state. The control unit 41 directs the all path traceback unit 43 to use the acs_surv bits 6 to trace back through the trellis for an entire epoch of T/2 samples at a time. As it traces back through the trellis, all path traceback unit 43 sends a decoded output 44 to the decoded sequence memory 45 for each of the N states in the trellis. The all path traceback unit 43 therefore needs N state pointers to identify the N surviving paths in the trellis. The N state pointers are updated for every branch in order to point to the previous state in the corresponding branch.

Figure 17:
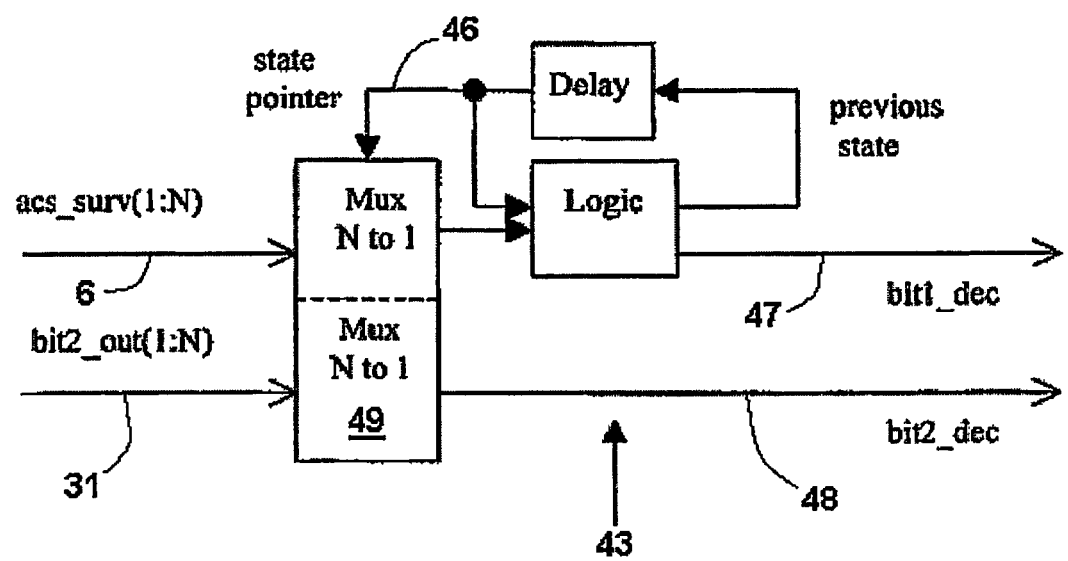
FIG. 17 is a block diagram of the all path traceback unit constructed according to the principles of the present invention.

Referring also to FIG. 17, the details of the all path traceback unit 43 can be understood. The state pointer 46 selects which of the N bits associated with the acs_surv bit 6 and the bit2_out bit 31 are to be utilized. The acs_surv bit 6, along with the state pointer 46 together generate the previous state in the path. They also generate the output bit 47, bit1_dec, which is an estimate of the information bit X1. The output bit 48, bit2_dec, corresponds to the chosen bit 31, bit2_out.

A significant feature afforded by the all path traceback unit 43 is the addition of the N to 1 multiplexer 49 associated with the input bit 31, bit2_out, for each of the eight trellis states. The decoded sequence memory 45 receives the decoded sequences 44 (bit1_dec and bit2_dec) from the all path traceback unit 43 for all of the trellis states. The decoded sequence memory 45 makes the decoded sequences available to the multiplexer 50 two epochs later and in reverse order. The input data 39 is written into the buffer memory 42 in the normal, forward order and passed to the all path traceback unit 43 in reverse order. The decoded output 44 of the all path traceback unit 43 is sent to the decoded sequence memory 45 and subsequently read from the sequence memory 45 in reverse order. The two reverse read operations cancel each other and the final decoded data 51 is in the correct, forward order. The two epoch delay introduced by the sequence memory 45 dictates a memory size of 2*T*N, or twice that used in prior art devices. The larger memory is required because of the need to store the additional input bit2_dec (bit 48, the estimated information bit X2) for each trellis state.

While the all path traceback unit 43 is reading and processing the ACS data 39 which had been buffered during the previous epoch, the forward trace unit 52 is tracing forwardly through the trellis using the acs_surv data of the current epoch. The forward trace unit 52 generates a path selection pointer, P, which is sent along signal path 53 to the multiplexer 50. The pointer P is associated with the minimum state path input signal 7, acs_min, generated by the ACS unit 8. The pointer P, which is updated during every epoch, points to the minimum state path and gives the state associated with this path two epochs earlier. The forward trace and path selection unit is of a conventional nature as is well known in the art. The multiplexer unit 50 uses the forward trace pointer P to select on of the N decoded sequences residing within the decoded sequence memory 45. The multiplexer output 51 is the corresponding decoded bit(s). Since the decoded sequence is composed of two bits (bit1_dec and bit2_dec) instead of the one bit (bit1_dec) found in prior art devices, the logic of multiplexer 50 is necessarily doubled.

As has been stated earlier, the trellis decoder architecture associated with the present invention is not limited to the embodiments described. Other architecture may be derived in accordance with the principles of the present invention. The principles embodied in the present invention are not restricted to the described eight state architecture. The functions of the elements described herein may be implemented in whole or in part within the programmed instructions of a microprocessor.

The invention claimed is:

1. In a system for processing video data comprising groups of interleaved trellis encoded data packets, apparatus for providing trellis decoded data, comprising:
    means for generating decision data associated with trellis state transitions in response to said video data, including a branch metric computer comprising means for selecting an estimated value for a second information data bit from a pair of first and second data bits;
    a traceback network responsive to said decision data including said estimated value for identifying a sequence of antecedent trellis states, as determined by a state transition trellis, wherein said antecedent states are identified for a sequence of collocated interleaved packets; and
    means responsive to said identified sequence of antecedent trellis states, for providing said trellis decoded data.

2. A system according to claim 1, further including means for calculating for a current trellis branch a value for a first data bit and an estimated value for the second information data bit.

3. In a system for processing video data comprising groups of interleaved trellis encoded data packets, apparatus for providing trellis decoded data, comprising;
    means for generating decision data associated with trellis state transitions in response to said video data, including a branch metric computer comprising means for selecting an estimated value for a second information data bit from a pair of first and second data bits;
    a traceback network responsive to said decision data for identifying a sequence of antecedent trellis states, as determined by a state transition trellis, wherein said antecedent states are identified for a sequence of collocated interleaved packets;
    means responsive to said identified sequence of antecedent trellis states, for providing said trellis decoded data;
    means for calculating for a current trellis branch a value for a first data bit and an estimated value for the second information data bit; and means for concurrently selecting the appropriate first data bit and second data bit into a trellis state in response to the selection of the minimum path metric into the trellis state.

4. In a system for processing video data comprising groups of interleaved trellis encoded data packets, apparatus for providing trellis decoded data, comprising;
    means for generating decision data associated with trellis state transitions in response to said video data, including a branch metric computer comprising means for selecting an estimated value for a second information data bit from a pair of first and second data bits;
    a traceback network responsive to said decision data for identifying a sequence of antecedent trellis states, as determined by a state transition trellis, wherein said antecedent states are identified for a sequence of collocated interleaved packets;
    means responsive to said identified sequence of antecedent trellis states for providing said trellis decoded data;
    means for calculating for a current trellis branch a value for a first data bit and an estimated value for the second information data bit; and means for concurrently selecting the appropriate first data bit and second data bit among all trellis states in response to the selection of the minimum path metric among all trellis states.

5. A system according to claim 4, wherein the traceback network further comprises means for storing the value of first data bit and the estimated value of the second data bit.

6. A system according to claim 5, further including means for providing a plurality of trellis decoded data sequences and means for identifying one of the plurality of trellis decoded data sequences with a pointer updated by identifying antecedent trellis states with said decision data.

7. A system according to claim 6, wherein the pointer selects one of the first data bits and one of the second data bits as correctly decoded data bits.

8. In a system for processing video data comprising groups of interleaved trellis encoded data packets formed from information data pairs containing a first data bit and a second data bit, a method of providing trellis decoded data comprising the steps of:
    generating decision data associated with trellis state transitions in response to said video data including calculating a value for a first data bit and estimating a value for a second data bit;
    identifying a sequence of antecedent trellis states in accordance with a state transition trellis, wherein said antecedent states are identified for a sequence of collocated interleaved packets in response to said decision data;

concurrently selecting the appropriate first data bit and second data bit into a trellis state in response to selection of a minimum path metric into the trellis state; and providing said trellis decoded data in response to said identified sequence of antecedent trellis states.

9. In a system for processing video data comprising groups of interleaved trellis encoded data packets formed from information data pairs containing a first data bit and a second data bit, a method of providing trellis decoded data comprising the steps of;

generating decision data associated with trellis state transitions in response to said video data including calculating a value for a first data bit and estimating a value for a second data bit;

identifying a sequence of antecedent trellis states in accordance with a state transition trellis, wherein said antecedent states are identified for a sequence of collocated interleaved packets in response to said decision data;

calculating for a current trellis branch the value of the first data bit and the estimated value of the second data bit;

concurrently selecting the appropriate first data bit and second data bit into a trellis state in response to selection of a minimum path metric into the trellis state; and providing said trellis decoded data in response to said identified sequence of antecedent trellis states.

10. A system according to claim 9, further comprising the step of concurrently selecting the appropriate first data bit and second data bit among all trellis states in response to the selection of the minimum path metric among all trellis states.

11. A system according to claim 9, further comprising the steps of:

providing a plurality of trellis decoded data sequences and;

identifying one of the plurality of trellis decoded data sequences with a pointer updated by identifying antecedent trellis states with said decision data.

12. A system according to claim 11, further comprising the step of updating the pointer once for each epoch.

13. In a system for processing video data according to claim 1, said apparatus further comprising:

a trellis decoder having a plurality of trellis branches and trellis states for decoding encoded symbols having at least a first, information data bit and a second information data bit, the trellis decoder comprising said branch metric computer, the branch metric computer being adapted to compute a metric value between the encoded symbol received by the trellis decoded and the encoded symbol associated with the trellis branches, the branch metric computer generating a plurality of output bits associated with a current trellis branch leading from a trellis state, the output bits identifying characteristics of the first and second information data bits.

14. The trellis decoder of claim 13, wherein the branch metric computer further comprises a plurality of computer subunits, each computer subunit being associated with a particular trellis state, each computer subunit generating a plurality of signals identifying an estimated characteristic of each trellis branch leaving the particular trellis state associated with the computer subunit.

15. The trellis decoder of claim 14 further comprising an add-compare-select unit, the add-compare-select unit receiving the branch metric computer output bits identifying characteristics of the first and second information data bits, the add-compare-select unit choosing the appropriate first and second bits based on the selection of the minimum path metric.

16. The trellis decoder of claim 15 wherein add-compare-select unit further comprises a plurality of add-compare-select subunits, each add-compare-select subunit being associated with a particular trellis state, each add-compare-select subunit choosing the appropriate first and second bits corresponding to each state based on the selection of the minimum path metric into the state.

17. The trellis decoder of claim 16 further comprising a traceback unit, the traceback unit receiving the estimate of the second data bit from each of the add-compare-select subunits and selecting one of the estimated second data bits as a correctly decoded data bit.

18. The trellis decoder of claim 17 wherein the traceback unit receives the value of the first data bit from each of the add-compare-select subunits and selects one of the first data bits as a correctly decoded data bit.

* * * * *